United States Patent
Komai et al.

(10) Patent No.: US 9,666,746 B2
(45) Date of Patent: May 30, 2017

(54) CONDUCTIVE BASE FOR FORMING WIRING PATTERN OF COLLECTOR SHEET FOR SOLAR CELLS, AND METHOD FOR PRODUCING COLLECTOR SHEET FOR SOLAR CELLS

(75) Inventors: Takayuki Komai, Shinjuku-ku (JP); Satoshi Emoto, Shinjuku-ku (JP)

(73) Assignee: Dai Nippon Printing Co., Ltd., Tokyo (JP)

(*) Notice: Subject to any disclaimer, the term of this patent is extended or adjusted under 35 U.S.C. 154(b) by 324 days.

(21) Appl. No.: 14/126,366

(22) PCT Filed: Jun. 14, 2012

(86) PCT No.: PCT/JP2012/065210
§ 371 (c)(1),
(2), (4) Date: Mar. 12, 2014

(87) PCT Pub. No.: WO2012/173178
PCT Pub. Date: Dec. 20, 2012

(65) Prior Publication Data
US 2014/0186989 A1    Jul. 3, 2014

(30) Foreign Application Priority Data

Jun. 14, 2011  (JP) ................. 2011-132438
Sep. 30, 2011  (JP) ................. 2011-217846

(51) Int. Cl.
*H01L 31/18* (2006.01)
*H01L 31/05* (2014.01)
(Continued)

(52) U.S. Cl.
CPC .............. *H01L 31/18* (2013.01); *B32B 15/01* (2013.01); *C23C 30/00* (2013.01); *C25D 5/48* (2013.01);
(Continued)

(58) Field of Classification Search
CPC ......... H01L 31/0516; H01L 31/022441; H01L 31/05; H01L 31/18; B32B 15/01;
(Continued)

(56) References Cited

U.S. PATENT DOCUMENTS 3,585,010 A    6/1971   Luce
5,338,619 A    8/1994   Fukuda et al.
(Continued)

FOREIGN PATENT DOCUMENTS

CN    1459219 A      11/2003
JP    S51-035711 B2  10/1976
(Continued)

OTHER PUBLICATIONS

International Search Report of PCT/JP2012/065210.
(Continued)

*Primary Examiner* — Michael Trinh
(74) *Attorney, Agent, or Firm* — Locke Lord LLP; Howard M. Gitten

(57) ABSTRACT

Provided are: a conductive base for forming a wiring pattern of a collector sheet for solar cells, which has good rust inhibiting properties and solderability without using an organic rust inhibitor that may harm a solar cell element; and a method for producing a collector sheet for solar cells, said method using the conductive base. A conductive base for forming a wiring pattern of a collector sheet for solar cells, which is a conductive base (30) wherein a zinc layer (320) composed of zinc is formed on the surface of a copper foil (310), is used. The conductive base for forming a wiring pattern of a collector sheet for solar cells is characterized in that the zinc layer (320) does not contain chromium and the amount of zinc therein is more than 20 mg/m² but 40 mg/m² or less.

5 Claims, 8 Drawing Sheets

(51) Int. Cl.
    B32B 15/01    (2006.01)
    C25D 5/48    (2006.01)
    C25D 7/06    (2006.01)
    C23C 30/00    (2006.01)
    H05K 1/09    (2006.01)
    C25D 3/22    (2006.01)
    H05K 3/06    (2006.01)

(52) U.S. Cl.
    CPC ............ C25D 7/0607 (2013.01); H01L 31/05 (2013.01); H01L 31/0516 (2013.01); H05K 1/09 (2013.01); C25D 3/22 (2013.01); H05K 3/06 (2013.01); H05K 2201/0338 (2013.01); H05K 2201/0355 (2013.01); H05K 2201/10143 (2013.01); Y02E 10/50 (2013.01); Y10T 428/12792 (2015.01)

(58) Field of Classification Search
    CPC ..... B32B 15/08; B32B 15/20; C23C 28/3225; H05K 2201/0355; H05K 2201/0338; H05K 2201/10143; H05K 1/09; H05K 3/06
    See application file for complete search history.

(56)            References Cited

U.S. PATENT DOCUMENTS

| 5,356,528 | A  | * | 10/1994 | Fukuda ................. | H05K 3/384 |
|           |    |   |         |                         | 148/265    |
| 6,071,629 | A  |   | 6/2000  | Yokota et al.           |            |
| 6,319,621 | B1 | * | 11/2001 | Arai .................... | C25D 3/56  |
|           |    |   |         |                         | 205/152    |
| 6,835,442 | B2 | * | 12/2004 | Kudo .................... | H05K 3/384 |
|           |    |   |         |                         | 174/254    |
| 2003/0121570 | A1 | * | 7/2003 | Oshima ................. | C23C 22/46 |
|           |    |   |         |                         | 148/267    |
| 2003/0132192 | A1 |   | 7/2003 | Kudo et al.            |            |
| 2003/0190492 | A1 | * | 10/2003 | Wada ................... | C23C 22/53 |
|           |    |   |         |                         | 428/659    |
| 2011/0272006 | A1 |   | 11/2011 | Sainoo et al.          |            |

FOREIGN PATENT DOCUMENTS

| JP | 56-087676 A      | 7/1981  |
| JP | S56-087677       | 7/1981  |
| JP | H04338694 A      | 11/1992 |
| JP | H06-006018 A     | 1/1994  |
| JP | H08-158074 A     | 6/1996  |
| JP | H09-326549 A     | 12/1997 |
| JP | 2000-178787 A    | 6/2000  |
| JP | 2000-280401 A    | 10/2000 |
| JP | 2002-217507 A    | 8/2002  |
| JP | 2005-340362 A    | 12/2005 |
| JP | 2007-081237 A    | 3/2007  |
| JP | 2010-199228 A    | 9/2010  |
| JP | 2010-202891 A    | 9/2010  |
| JP | 2011129858 A     | 6/2011  |
| WO | WO-2009/063764 A1 | 5/2009 |
| WO | WO-2010/082594 A1 | 7/2010 |

OTHER PUBLICATIONS

Office Action mailed Dec. 15, 2015, issued for the Japanese patent application No. 2011-132438.

Extended European 2015 Search Report issued to EP Application No. 12800136.9, dated Jan. 28, 2015.

Office Action issued to Chinese Application No. 201280038899.5, dated Feb. 28, 2015.

Office Action for Japanese Application No. 2011-132438 mailed Mar. 31, 2015.

Office Action dated Aug. 20, 2015 in Korean Application No. 10-2013-7033934.

* cited by examiner

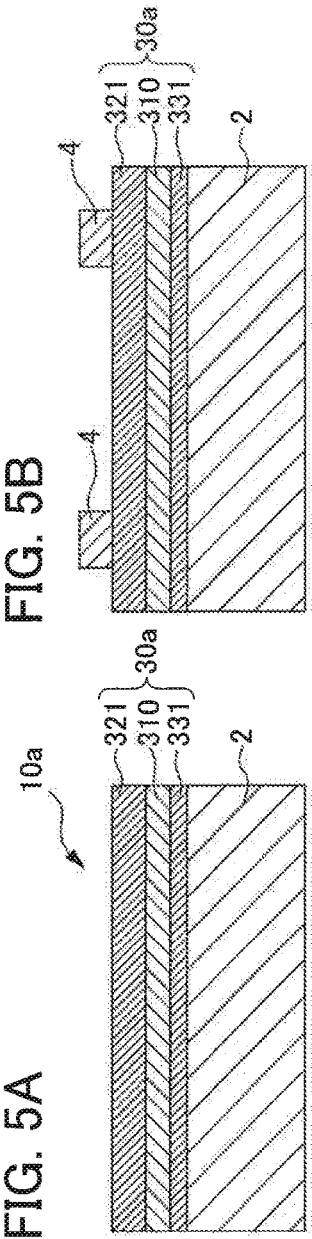
FIG. 5A
FIG. 5B
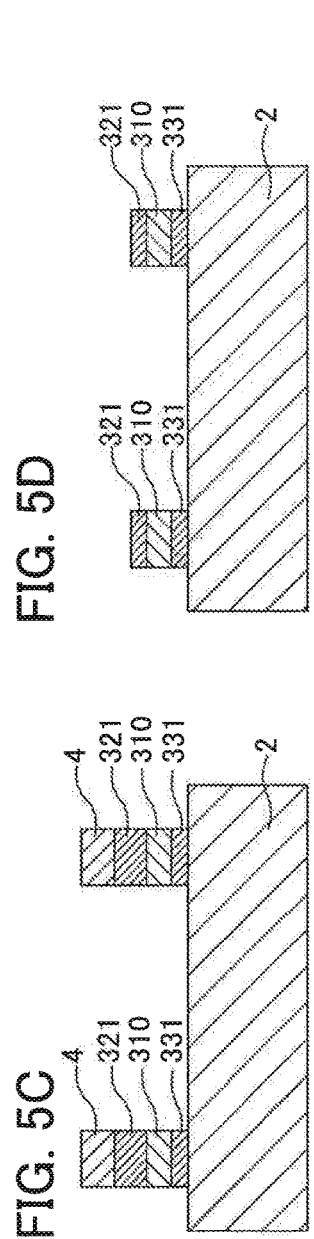
FIG. 5C
FIG. 5D
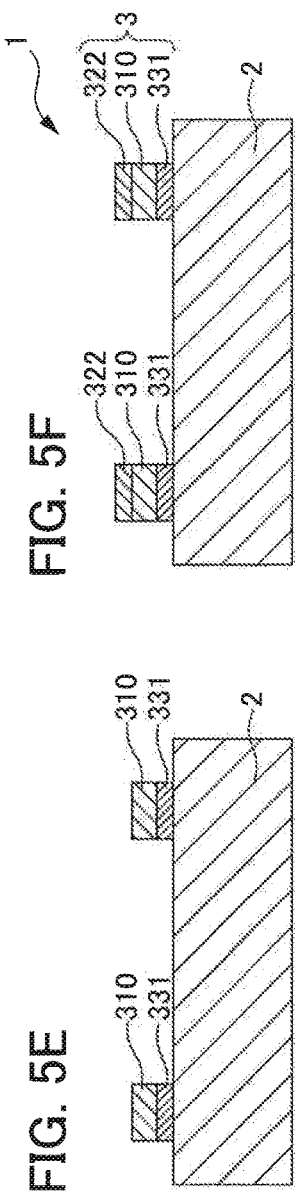
FIG. 5E
FIG. 5F

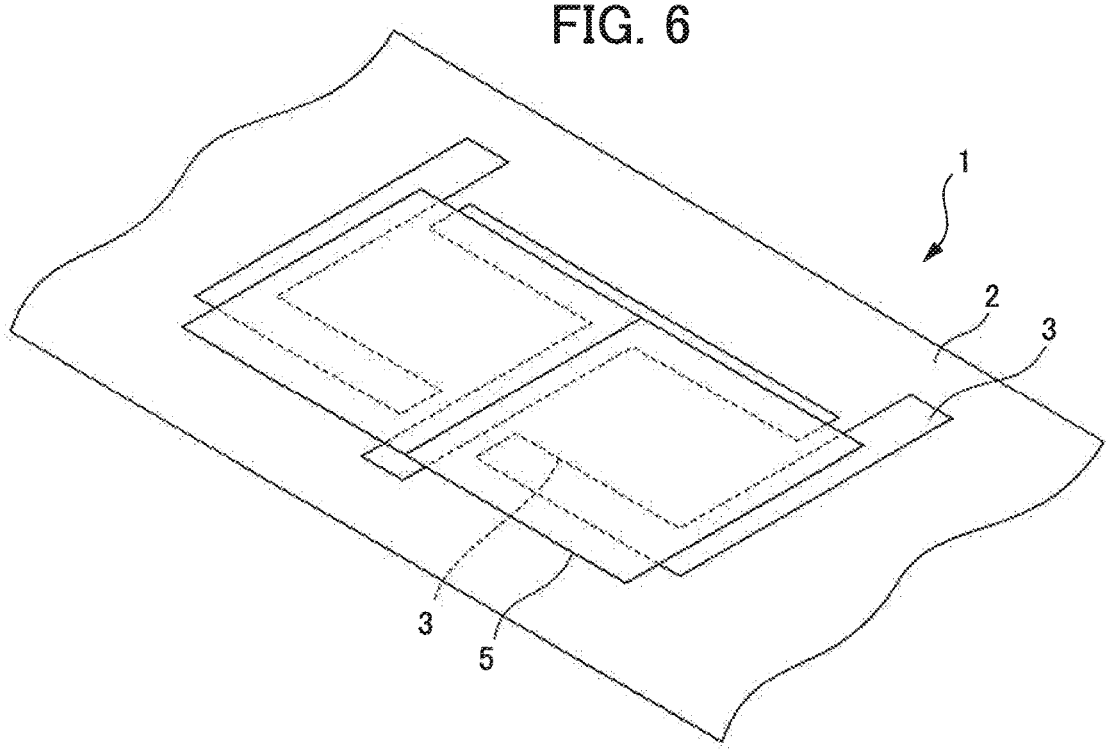

CONDUCTIVE BASE FOR FORMING WIRING PATTERN OF COLLECTOR SHEET FOR SOLAR CELLS, AND METHOD FOR PRODUCING COLLECTOR SHEET FOR SOLAR CELLS

CROSS-REFERENCE TO RELATED APPLICATIONS

This application is the national phase under 35 U.S.C. §371 of PCT International Application No. PCT/JP2012/065210, filed Jun. 14, 2012, which claims the benefit of Japanese Patent Application No. 2011-132438, filed Jun. 14, 2011, and Japanese Patent Application No. 2011-217846, filed Sep. 30, 2011, the entire contents of the aforementioned applications are hereby incorporated herein by reference.

TECHNICAL FIELD

The present invention relates to a conductive base for forming a wiring pattern of a collector sheet for solar cells, which is used as a wiring in a solar cell module, and to a method for producing a collector sheet for solar cells.

BACKGROUND ART

In recent years, with a rise in awareness of environmental problems, solar cells have been receiving attention as a clean energy source. In general, a solar cell module constituting a solar battery has a structure in which a transparent front board, a surface side sealer sheet, a solar cell element, a back surface side sealer sheet, and a back surface protecting sheet are laminated in this order when viewed from the side of the light-receiving surface, and it has a function of generating electricity from sunlight incident on the solar cell element.

A plurality of solar cell elements, which generate electricity within a solar cell module, are provided within a solar cell module, and they are configured to generate necessary voltage and current by being connected in series-parallel combination. To wire the plurality of solar cell elements within the solar cell module, for example, a collector sheet for solar cells is used, in which metal foil to be a wiring pattern is laminated on the surface of a resin sheet as a base (see, Patent Document 1). Then, the wiring pattern composed of a metal foil and the output electrodes of the solar cell element are electrically joined to each other by soldering.

To form the wiring pattern on the surface of the resin sheet as a base for the collector sheet for solar cells, the same method as that used to make a printed wiring board, for example, can be used; that is, a conductive base composed of a metal foil is first laminated onto the whole surface of the base, and then the conductive base is etched into the desired wiring pattern by photolithography.

However, the surface of the copper foil generally used as the aforementioned conductive base is very easily oxidized. Furthermore, the surface of the oxidized copper foil has extremely low wettability for solder. For such reasons, the surface of the copper foil to be a wiring pattern needs to be subjected to rust inhibiting processing.

From this point of view, on a printed wiring board, a rust inhibiting treatment using an organic rust inhibitor, such as a method of coating a rust inhibiting coating film onto the surface of a copper foil to be a wiring pattern (see, Patent Document 2) and a method of forming a coating film having a complex structure formed with copper on the surface of a wiring pattern (see, Patent Document 3), is performed on the surface of the conductive base to be a wiring pattern. Since a printed wiring board obtained after a rust inhibiting treatment has inhibited oxidation on the surface of the wiring pattern, good wettability for solder is maintained, and thus it is desirable from the viewpoint of having reliable installation of an electronic component onto the printed wiring board by soldering.

However, the collector sheet for solar cells is put to use in a solar cell element-joined state while being exposed to sunlight for a long period of time like several tens of years. For such reasons, when a rust inhibiting treatment using an organic rust inhibitor, like in the case of a printed wiring board, is performed, the organic rust inhibitor itself or a compound generated by decomposition of the inhibitor exerts a bad influence on the solar cell element during use for a long period of time, and thus may cause performance degradation of the solar cell module.

The conductive base for forming a wiring pattern of a collector sheet for solar cells requires a rust inhibiting treatment that does not use an organic rust inhibitor. As such a rust inhibiting treatment, treatment forming a rust inhibiting layer on a copper foil by plating containing chrome and zinc, is performed (see, Patent Document 4).

Alternatively, a copper foil having a chrome-free property and also a rust inhibiting property by forming a surface treated layer composed of a nickel-zinc alloy in which the content ratio of nickel is limited to 50% or more on the surface has been also suggested (see, Patent Document 5).

[Patent Document 1] Japanese Unexamined Patent Application, Publication No. 2007-081237
[Patent Document 2] Japanese Unexamined Patent Application, Publication No. H9-326549
[Patent Document 3] Japanese Unexamined Patent Application, Publication No. H6-006018
[Patent Document 4] Japanese Unexamined Patent Application, Publication No. 2000-178787
[Patent Document 5] Japanese Unexamined Patent Application, Publication No. 2010-202891

DISCLOSURE OF THE INVENTION

Problems to be Solved by the Invention

However, when the copper foil described in Patent Document 4, that is, a copper foil having a rust inhibiting layer formed on the surface by plating containing chrome or the like, is used as the conductive base for forming the wiring pattern of a collector sheet of solar cells, there is a problem in that a bad influence is exerted on the composition for preventing degradation of wettability for solder caused by oxidation of the copper foil and also for forming a rust inhibiting protection layer, in particular, the chrome exerts a bad influence on the wettability of the wiring pattern for solder, and thus certainty of the joining of the electrode of a solar cell element to a collector sheet for solar cells mediated by soldering is impaired.

Furthermore, regarding the copper foil described in Patent Document 5, no consideration is given to the bad influence generally exhibited by nickel on solder processing suitability, that is, wettability for solder, and nickel is essentially required at a high distribution ratio or more to have a chrome-free state, and thus the cost is high.

As described above, although various treatments for the purpose of having a rust inhibiting property are carried out on a conductive base composed of a copper foil used for the wiring pattern of a collector sheet for solar cells, they all exhibit an undesirable influence on the solder processing suitability required for the wiring pattern of a collector sheet for solar cells. A conductive base with a rust inhibiting property as a conductive base and a solder processing suitability when prepared as a wiring pattern, both at high level, has been in demand. However, no such conductive base is present yet. Accordingly, the present state is to widely use a conductive base composed of a copper foil that has a surface treatment layer obtained by plating containing chrome or the like, as a common product obtainable at relatively low cost, while there is still room for improvement in terms of solder processing suitability.

The present invention is achieved by considering the circumstances described above, and an object is to form the wiring pattern of a collector sheet for solar cells having good rust inhibiting properties and solderability without using an organic rust inhibitor.

Means for Solving the Problems

The inventors of the present invention conducted intensive studies to solve the problems described above, and as a result found that by using a conductive base not using chrome, which is generally considered to be essential as a rust inhibitor, and having a protective film consisting of a predetermined adhesion amount of zinc on the surface of the copper foil used as the conductive base for forming a wiring pattern, good rust inhibiting properties and solderability can be obtained simultaneously from a wiring pattern of a collector sheet for solar cells, and they completed the present invention accordingly. More specifically, the present invention provides the following.

(1) A conductive base used for the wiring pattern of a collector sheet for solar cells, in which a zinc layer with an adhesion amount of more than 20 mg/m$^2$ but 40 mg/m$^2$ or less is formed on at least one surface of copper foil having a thickness of 10 μm to 35 μm.

(2) The conductive base described in (1), in which the copper foil is prepared by electrolytic foil forming and the zinc layer is formed on the glossy surface of the copper foil.

(3) The conductive base described in (1) or (2), in which one or more function reinforcing layers are formed on the zinc layer and chrome is not contained in any layer of the function reinforcing layers.

(4) A method for producing a collector sheet for solar cells including: a laminating step by which the conductive base described in any one of (1) to (3) is laminated with a resin base to obtain a laminate; an etching step by which an etching mask patterned to have the desired wiring pattern shape is formed on the surface of the laminate followed by an etching treatment to remove the conductive base in an area not covered by the etching mask; and a peeling step by which the etching mask is removed after the etching step by using an alkaline peeling liquid, in which by removing a part of the surface of the zinc layer with the peeling of the etching mask by using the alkaline peeling liquid during the peeling step, a rust inhibiting protection layer, in which the adhesion amount of zinc is more than 0.5 mg/m$^2$ but 20 mg/m$^2$ or less, is formed on the surface of the wiring pattern.

(5) A method for producing a collector sheet for solar cells including: a laminating step by which a conductive base having a first rust inhibiting protection layer formed on the surface of copper foil is laminated with a resin base to obtain a laminate; an etching step by which an etching mask patterned to have the desired wiring pattern shape is formed on the surface of the laminate followed by an etching treatment to remove the conductive base in the area not covered by the etching mask; a step for removing the first rust inhibiting protection layer by which the first rust inhibiting protection layer is removed from the surface of the copper foil; and a step for forming a second rust inhibiting protection layer by which a second rust inhibiting protection layer is formed on the copper foil after the step for removing the first rust inhibiting protection layer, in which the first rust inhibiting protection layer is composed by containing at least a rust inhibitor other than zinc or tin, and the second rust inhibiting protection layer is composed of zinc.

(6) The method for producing a collector sheet for solar cells described in (5), in which the step for removing the first rust inhibiting protection layer and the step for forming the second rust inhibiting protection layer are continuously performed in the same production facility.

(7) The method for producing a collector sheet for solar cells described in (5) or (6), in which the step for removing the first rust inhibiting protection layer is a step for removing the first rust inhibiting protection layer by chemical polishing using an acidic cleaning agent.

(8) The method for producing a collector sheet for solar cells described in any one of (5) to (7), in which the second rust inhibiting protection layer formed by the step for forming the second rust inhibiting protection layer is a layer composed of zinc and the adhesion amount of zinc on the surface of the copper foil is more than 0.5 mg/m$^2$ but 20 mg/m$^2$ or less.

(9) The method for producing a collector sheet for solar cells described in any one of (5) to (8), in which the first rust inhibiting protection layer is a layer containing chrome and zinc.

(10) A method for producing a solar cell module including: a step for producing a collector sheet for solar cells by which it is produced by the method for producing a collector sheet for solar cells described in any one of (4) to (9); a solder joining step by which an electrode of a solar cell element is joined by solder processing to the surface of the wiring pattern of the collector sheet for solar cells that is produced by the aforementioned step for producing a collector sheet for solar cells; and a module integration step by which a joined body consisting of the solar cell element and the collector sheet for solar cells that are joined by the solder joining step is laminated with other members constituting the solar cell module for integration.

Effects of the Invention

According to the present invention, a conductive base for forming a wiring pattern of a collector sheet for solar cells having good rust inhibiting properties and solderability without using an organic rust inhibitor, which has the possibility of exhibiting a bad influence on a solar cell element, is provided.

BRIEF DESCRIPTION OF THE DRAWINGS

FIG. 1(a) is a plan view and FIG. 1(b) is a longitudinal sectional view taken along line A-A of FIG. 1(a).

FIGS. 5(a) to 5(f) are schematic diagrams sequentially illustrating the wiring pattern formation according to the second embodiment of the method for producing the wiring sheet of the present invention.

FIG. 6 is a perspective view schematically illustrating the state in which the collector sheet for solar cells produced by the method for producing a collector sheet for solar cells of the present invention is joined to a solar cell element.

Figure 1A:
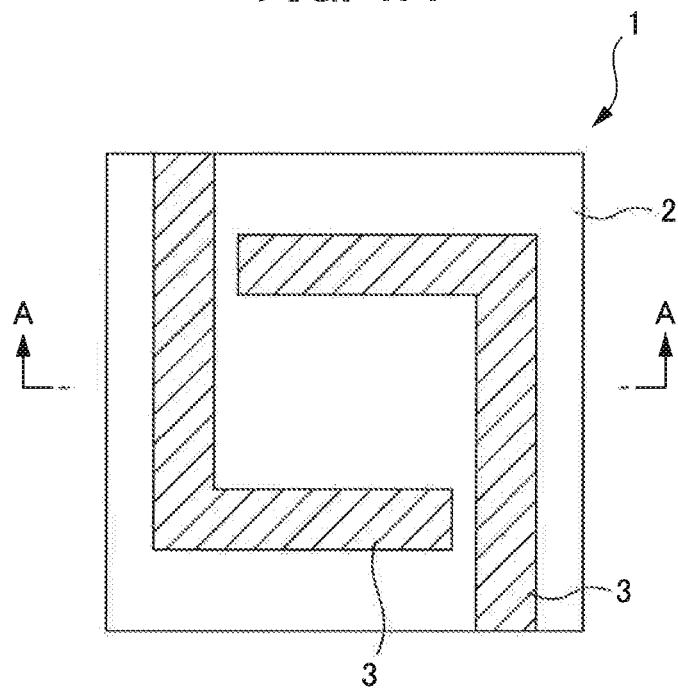
FIGS. 1(a) and (b) are schematic diagrams illustrating a collector sheet for solar cells in which a conductive base for forming the wiring pattern of a collector sheet for solar cells of the present invention is used.

EXPLANATION OF REFERENCE NUMERALS 1 collector sheet for solar cells
10 laminate
10a second laminate
2 resin base
3 wiring pattern
30 conductive base
30a second conductive base
31 conductive layer
32 rust inhibiting protection layer
33 rear surface protection layer
310 copper foil
320 zinc layer
321 first rust inhibiting protection layer
322 second rust inhibiting protection layer
330 rear surface zinc layer
331 rear surface treatment layer
4 etching mask
5 solar cell element
6 transparent front board
7 surface side sealer sheet
8 back surface side sealer sheet
9 back surface protection sheet
100 solar cell module

PREFERRED MODE FOR CARRYING OUT THE INVENTION

Preferred modes of the present invention are described with reference to drawings. First, explanations are given for a collector sheet for solar cells (hereinafter, also simply referred to as a "collector sheet for solar cells") that can be produced by using a conductive base for forming the wiring pattern of a collector sheet for solar cells of the present invention (hereinafter, also simply referred to as a "conductive base"), and the conductive base of the present invention is described later. Hereinafter, a method for producing a collector sheet for solar cells according to the present invention and a method for producing a solar cell module by using the collector sheet for solar cells according to the present invention are described in this order.

Collector Sheet for Solar Cells

Figure 1B:
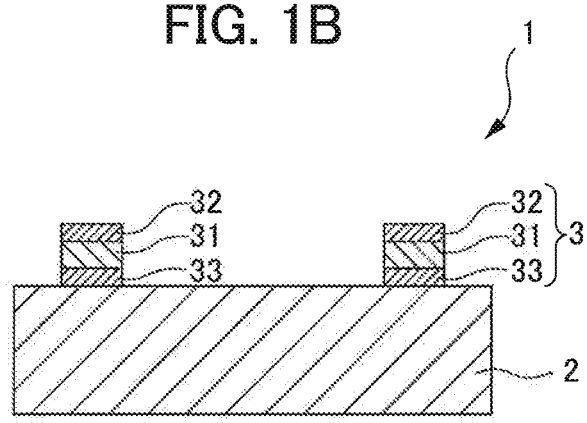

FIGS. 1(a) and (b) are schematic diagrams of a collector sheet for solar cells in which FIG. 1(a) is a plan view and FIG. 1(b) is a longitudinal sectional view taken along line A-A of FIG. 1(a).

In collector sheet 1 for solar cells, a wiring pattern 3 is formed on the surface of a resin base 2. With regard to the collector sheet 1 for solar cells, the wiring pattern 3 and an output electrode of the solar cell element are electrically joined by solder processing so that electric wiring is formed among a plurality of solar cell elements in a solar cell module to collect electricity from the solar cell element.

The resin base 2 is a resin molded into a sheet shape. As described herein, the sheet shape is a concept including a film shape, and, in the present invention, there is no difference between them. Examples of the resin constituting the resin base 2 include a polyethylene resin, a polypropylene resin, a cyclic polyolefin resin, a polystyrene resin, an acrylonitrile-styrene copolymer, an acrylonitrile-butadiene-styrene copolymer, a polyvinyl chloride resin, a fluorine resin, a poly(meth)acrylic resin, a polycarbonate resin, a polyester resin such as polyethylene terephthalate (PET) or polyethylene naphthalate (PEN), a polyamide resin such as various nylons, a polyimide resin, a polyamide imide resin, a polyarylphthalate resin, a silicone resin, a polysulfone resin, a polyphenylene sulfide resin, a polyether sulfone resin, a polyurethane resin, an acetal resin, and a cellulose resin. Among them, from the viewpoint of providing favorable heat resistance to the collector sheet 1 for solar cells during solder processing, polyethylene terephthalate (PET), polyethylene naphthalate (PEN), a polyamide imide resin, and a polyimide resin are preferable. Polyethylene terephthalate (PET) and polyethylene naphthalate (PEN) are most preferable. Furthermore, the resin base 2 is not limited to a sheet with a single layer and may be a multilayer resin obtained by laminating a sheet consisting of a plurality of different resins from among the aforementioned resins. The thickness of the resin base 2 may be suitably determined according to the strength or thickness that is required for the collector sheet 1 for solar cells. The thickness of the resin base 2 is, although not particularly limited, from 20 to 250 μm, for example.

The wiring pattern 3 is an electric wiring formed on the surface of the collector sheet 1 for solar cells to have the desired wiring shape (wiring pattern). As illustrated in FIG. 1(b), the wiring pattern 3 is provided with at least a conductive layer 31 composed of a copper foil and a rust inhibiting protection layer 32. Furthermore, the wiring pattern 3 may be further provided with a rear surface rust inhibiting protection layer 33 between the conductive layer 31 and the resin base 2.

The conductive layer 31 is a layer composed of a copper foil to give conductivity to the wiring pattern 3. The thickness of the conductive layer may be suitably determined depending on the level of the withstand current required for the collector sheet 1 for solar cells, or the like. The thickness of the conductive layer is not particularly limited, but may be 10 to 35 μm, for example.

Both of the rust inhibiting protection layer 32 and the rear surface rust inhibiting protection layer 33 are a thin layer composed of zinc, which is formed on the surface of the copper foil to suppress the oxidation of the surface of the conductive layer 31 composed of copper foil.

Conductive Base for Forming Wiring Pattern of Collector Sheet for Solar Cells

Figure 2:
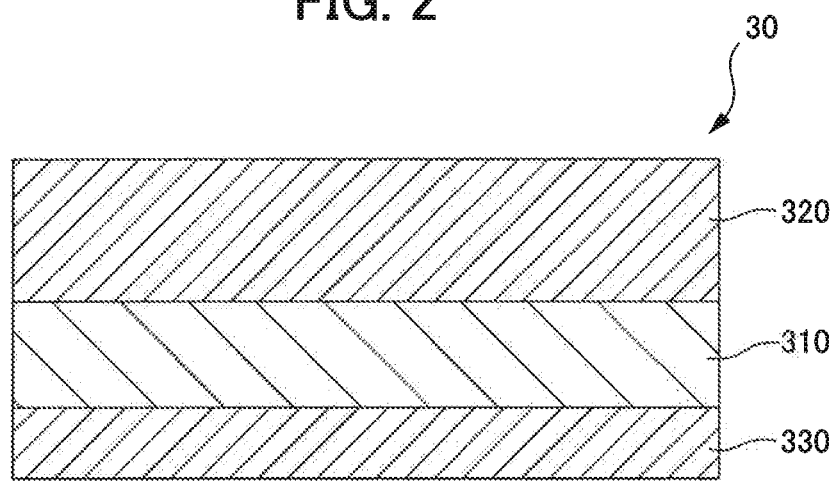
FIG. 2 is a schematic diagram illustrating the layer configuration of the conductive base for forming the wiring pattern of a collector sheet for solar cells of the present invention.

Next, explanations are given for a conductive base 30 with reference to FIG. 2. FIG. 2 is a schematic diagram illustrating the layer configuration of the conductive base 30 of the present invention.

The conductive base 30 is a conductive thin film produced by forming a zinc layer 320 on at least one surface of a copper foil 310, and it can be preferably used as a base for constituting the wiring pattern 3 when the collector sheet 1 for solar cells is produced by the production method that is described below in detail. In the conductive base 30, the other surface of the copper foil 310 on which the zinc layer 320 is not formed is not particularly limited in terms of layer configuration or the like. However, it is preferable that at least some rust inhibiting treatment be performed thereon, and the rear surface zinc layer 330 composed of zinc is formed on the conductive base 30 of the present example.

When the conductive base 30 becomes the wiring pattern 3 in the collector sheet 1 for solar cells, the copper foil 310 becomes the connection portion of the wiring pattern 3. The wiring pattern 3 is required to have high conductivity and processing suitability for molding, and the copper foil 310 fully satisfies those requirements.

The thickness of the copper foil 310 may be suitably determined depending on the level of withstand current required for the collector sheet 1 for solar cells, or the like. The thickness of the copper foil 310 is not particularly limited, but may be 10 to 35 μm, for example.

The copper foil 310 can be produced as a foil according to a known production method including an electrolytic method and a rolling method. The production method is not particularly limited, and preferred examples include an electrolytic foil forming method. The electrolytic foil forming method includes, with an electrolytic facility in which a rotating drum anode partially immersed in an electrolytic bath faces an arc-like cathode via a clearance and the electrolytic liquid is circulated between them, electro-depositing copper on the rotating drum and finally peeling a copper foil with a certain thickness from the drum to form the copper foil. According to the copper foil produced by this method, the surface closely attached on the rotating drum side during foil forming becomes a glossy surface with extremely low surface roughness while the opposite surface becomes a rough surface with relatively large surface roughness.

A copper foil having both a glossy surface and a rough surface can be particularly preferably used as the copper foil 310 for constituting the conductive base 30. When the copper foil having both a glossy surface and a rough surface is used as the copper foil 310, by forming the zinc layer 320 that is described below in detail on the glossy surface side, the conductive base 30 having particularly excellent solder processing suitability can be produced.

The zinc layer 320 is a layer composed of zinc that is formed as a thin film on one surface of the copper foil 310, preferably on the glossy surface, in order to suppress the oxidation of the surface of the copper foil 310. Herein, the surface side for forming the zinc layer 320 in the conductive base 30 becomes a surface side on which the wiring pattern 3 is joined to an electrode of a solar cell element, when it is used for the wiring pattern 3 of the collector sheet 1 for solar cells. For such reasons, solderability is required in addition to the rust inhibiting properties on the surface side for forming the zinc layer 320. It has been conventionally believed to be essential to form a chrome layer in addition to a zinc layer when a rust inhibiting treatment not using an organic rust inhibitor is applied to the surface of copper foil. However, the conductive base 30 of the present invention is characterized in that, by forming a zinc layer having a limited adhesion amount on the surface for joining to an electrode of a solar cell element, not only the rust inhibiting property required for the application as a collector sheet for solar cells is surely obtained but also, at least at the time of using it as the wiring pattern for a collector sheet of solar cells, the very surface is prepared to be chrome-less to enhance the solder processing suitability.

Methods for forming the zinc layer 320 on the surface of the copper foil 310 are not particularly limited, and the zinc layer 320 may be formed by zinc plating, sputtering, or vapor deposition of zinc. Among them, a conventionally known electrolytic plating method can be preferably used. The plating liquid may also contain, in addition to zinc, a complexing agent, ammonia water, or the like, if necessary. Regarding the plating conditions, the temperature of the plating liquid is preferably in the range from 15° C. to 50° C.

Herein, regarding the zinc layer 320 of the conductive base 30, a part of the surface of the rust inhibiting protection layer 32a, which remains on the wiring pattern 3, is removed during the peeling step for removing the etching mask after the etching step as described below in detail, and finally, a rust inhibiting protection layer 32b, which is thinner than the original zinc layer 320, is yielded on the wiring pattern 3 (see, FIG. 3). The conductive base 30 is prepared so that when it becomes the wiring pattern 3 of the collector sheet 1 for solar cells, it can provide a rust inhibiting property, stability for the solar cell element, and good solderability for the wiring pattern 3 of the collector sheet 1 for solar cells by adjusting in advance the adhesion amount of zinc in the zinc layer 320 to have a suitable amount of zinc adhesion amount in the rust inhibiting protection layer 32 (32b) as described below.

Specifically, the adhesion amount of zinc for forming the rust inhibiting protection layer 32 on the surface of the conductive layer 31 in a state in which the conductive base 30 becomes the wiring pattern 3 of the collector sheet 1 for solar cells is preferably more than 0.5 mg/m$^2$ but 20 mg/m$^2$ or less, and more preferably more than 0.5 mg/m$^2$ but 6 mg/m$^2$ or less. When the adhesion amount of zinc for forming the rust inhibiting protection layer 32 is within this range, the collector sheet 1 for solar cells can have a rust inhibiting property, stability for a solar cell element, and good solderability.

The aforementioned adhesion amount of zinc is an extremely small amount for forming a thin film. For such reasons, it is believed that the thin film formed with such a trace amount of zinc has a thickness level of several atoms, and it is also believed that there are film defects occurring in several areas. Due to the presence of such film defects, it is believed that the copper of the conductive layer 31 present on the lower layer of the rust inhibiting protection layer 32 is exposed in several areas, and therefore both the solderability and rust inhibiting property can be obtained.

To have the aforementioned adhesion amount of the rust inhibiting protection layer 32 which is finally formed on the wiring pattern 3 of the collector sheet 1 for solar cells, in the conductive base 30, the adhesion amount of zinc in the zinc layer 320 formed on the copper foil 310 is set to be more than 20 mg/m$^2$ but 40 mg/m$^2$ or less. Furthermore, it is more preferably more than 25 mg/m$^2$ but 35 mg/m$^2$ or less. If the adhesion amount of zinc is less than 20 mg/m$^2$ in the zinc layer 320, it is difficult to have the adhesion amount of zinc for forming the rust inhibiting protection layer 32b of more than 0.5 mg/m² after the etching treatment, and thus the rust inhibiting property of the wiring pattern 3 becomes insufficient. Furthermore, if the adhesion amount of zinc is more than 40 mg/m² in the zinc layer 320, the adhesion amount of zinc for forming the rust inhibiting protection layer 32b becomes more than 20 mg/m² when the etching treatment is performed according to general conditions, and thus the solderability of the wiring pattern 3 is impaired. Furthermore, although it is possible to increase the zinc removal amount for preventing this, it is undesirable in that the cost related to zinc to be removed also increases.

According to the present embodiment, by forming the zinc layer 320 in a specific adhesion amount on the surface of the copper foil 310 of the conductive base 30 as described above, both the solderability and rust inhibiting property are obtained for the collector sheet 1 for solar cells as a final product. Basically, zinc has an insufficient adhesion property for solder. However, the inventors of the present invention surprisingly found that when the adhesion amount of zinc for forming the rust inhibiting protection layer 32, which is formed on the surface of the conductive layer 31 of the wiring pattern 3 of the collector sheet 1 for solar cells, is more than 0.5 mg/m² but 20 mg/m² or less, a decrease in solder processing suitability caused by zinc is inhibited and also oxidation of copper constituting the conductive layer 31 is sufficiently inhibited during a time period of two months or so, and they also found that when the adhesion amount of zinc for constituting the zinc layer 320 of the conductive base 30 as a constitutional material of the wiring pattern 3 is more than 20 mg/m² but 40 mg/m² or less, oxidation of the copper for constituting the copper foil 310 can be sufficiently inhibited during a time period of three months or so. The present invention is completed based on the above findings.

Although the collector sheet 1 for solar cells is required to have a very high rust inhibiting property against oxidation of the wiring pattern before joining it to a solar cell element, once it is integrated into the solar cell module, the surface of the copper foil is covered by soldering and the constitutional members of the solar cell module have a high gas barrier property, and thus it is in a state not easily allowing the oxidation of copper foil. Furthermore, once the integration is completed, a visually unrecognizable small amount of oxidation does not cause a problem. Therefore, as long as it can exhibit the rust inhibiting property that is required during the aforementioned time period, it is not insufficient at all for an actual application. Under the circumstances described above, the conductive base of the present invention can be used as a very preferable member when it is applied for forming the wiring pattern of a collector sheet for solar cells.

The surface of the conductive base 30 opposite to the surface on which the zinc layer 320 is formed becomes the surface of the wiring pattern 3 to which the resin base 2 is joined when it is used as the wiring pattern 3 of the collector sheet 1 for solar cells. For such reasons, although it is not required to have the rust inhibiting property or solderability that is as high as those of the surface on which the zinc layer 320 is formed, it is preferable to form the rear surface zinc layer 330 to ensure a suitable rust inhibiting property. When the zinc layer 320 is formed by the aforementioned plating method, the rear surface zinc layer 330 is generally formed at the same time. However, as the rear surface zinc layer 330 is not required to have the same physical properties as the zinc layer 320, it is not an essential constitutional element of the present invention.

In addition to each layer described above, the conductive base 30 may be also provided with other function reinforcing layers, if necessary. Examples of the function reinforcing layer include a heat resistant layer containing laminated nickel or the like and an adhesion improvement layer formed on a rough surface in which a silane coupling agent or the like is used, but are not limited thereto. However, when the function reinforcing layer is formed on the surface of the zinc layer 320, it is preferably formed as a layer not containing chrome to avoid a negative influence on the solder processing suitability.

Meanwhile, with regard to the surface opposite to the zinc layer 320, which becomes the surface for joining to the resin base 2, an adhesion improvement layer using a silane coupling agent or the like or a roughening treatment layer laminated with various rough particles may be preferably formed to improve adhesion to the resin base. As it is not necessary to be concerned about those layers having an influence on the solder processing suitability, it is not particularly necessary to exclude chrome.

Meanwhile, with the collector sheet 1 for solar cells produced by using the conductive base 30, so-called soldering short circuit can be preferably inhibited. Specifically, as the collector sheet 1 for solar cells has excellent wettability for solder, there are almost no solder residues on the insulating region between wirings. For such reasons, the collector sheet 1 for solar cells is preferably used not only for a high density wiring in which the pitch between wirings is 1 mm or less but also for a high density wiring in which the pitch between wirings is 200 µm or less or a high density wiring in which the pitch between wirings is 100 µm or less.

Method for Producing Collector Sheet for Solar Cells (First Embodiment)

Next, the first embodiment of the method for producing a collector sheet for solar cells of the present invention is described with reference to FIGS. 3(a) to 3(d). FIGS. 3(a) to 3(d) are schematic diagrams sequentially illustrating the wiring pattern formation according to the first embodiment of the method for producing the collector sheet 1 for solar cells of the present invention.

Figure 3A:
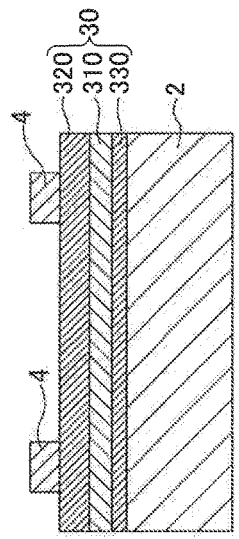
FIGS. 3(a) to 3(d) are schematic diagrams sequentially illustrating the wiring pattern formation according to the first embodiment of the method for producing the wiring sheet of the present invention.

According to the first embodiment of the method for producing the collector sheet 1 for solar cells of the present invention, the collector sheet 1 for solar cells described above can be produced. According to the first embodiment of the method for producing the collector sheet 1 for solar cells, as illustrated in FIG. 3(a), the collector sheet 1 for solar cells is produced by forming a laminate 10 based on a laminating step by which the conductive base 30 according to the present invention is laminated onto the surface of the resin base 2 and by performing the etching step and the peeling step for the laminate 10.

[Laminating Step]

With regard to the joining of the conductive base 30 of the present invention onto the surface of the resin base 2, a known method can be used without any specific limitation. Examples of the method include a method of attaching the conductive base 30 onto the surface of the resin base 2 using an adhesive agent. In particular, a method of attaching the conductive base 30 onto the surface of the resin base 2 based on a dry lamination using a urethane, polycarbonate, or epoxy adhesive agent is preferable. At that time, when the copper foil 310 for constituting the conductive base 30 has a glossy surface and a rough surface, the resin base 2 is joined onto the rough surface.

[Etching Step]

The etching step is a step for removing the conductive base 30 in the area not covered by the etching mask 4 by performing the etching treatment after producing the etching mask 4, which has been patterned to the desired wiring pattern shape, on the surface of the conductive base 30.

As described above, the laminate 10 used for this step has the conductive base 30 laminated onto the surface of the resin base 2. The zinc layer 320 composed of zinc is partially removed during the peeling step to be described below to become the rust inhibiting protection layer 32b. For such reasons, the adhesion amount of zinc in the zinc layer 320 can be suitably adjusted depending on conditions for the peeling step or the like, and according to general conditions for the peeling step, when the adhesion amount of zinc in the zinc layer 320 is adjusted within the range of more than 20 mg/m$^2$ but 40 mg/m$^2$ or less, it is possible that the adhesion amount of zinc in rust inhibiting protection layer 32b is adjusted to more than 0.5 mg/m$^2$ but 20 mg/m$^2$ or less, and by doing so, the collector sheet 1 for solar cells can be prepared to have a favorable rust inhibiting property, stability for the solar cell element, and solderability.

Figure 3B:
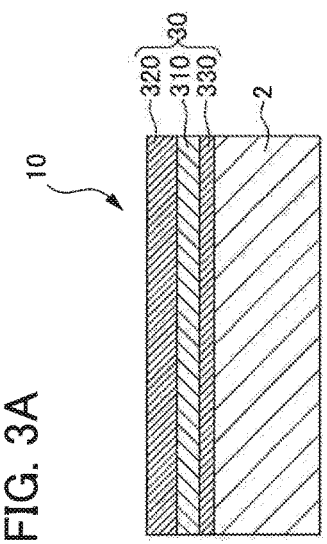

According to this step, as illustrated in FIG. 3(b), the etching mask 4 patterned to the desired wiring pattern shape is firstly produced on the surface of the conductive base 30 (that is, the surface of the zinc layer 320). The etching mask 4 is created to avoid corrosion of the rust inhibiting protection layer 32a, which later will be the wiring pattern 3, and the conductive layer 31, as caused by the etching liquid during the etching step to be described below. In other words, the shape observed from the plane of the wiring pattern 3 to be produced and the shape observed from the plane of the etching mask 4 are identical to each other. Methods for forming the etching mask 4 are not particularly limited. The etching mask 4 may be formed on the surface of the conductive base 30 by, for example, sensitizing a photoresist or a dry film by passing via a photomask followed by development, or may be formed on the surface of the conductive base 30 according to a printing method using an ink jet printer or the like.

The etching mask 4 is required to be peeled with an alkaline peeling liquid during the peeling step to be described below. From this point of view, it is preferable to produce the etching mask 4 by using a photoresist or a dry film.

Figure 3C:
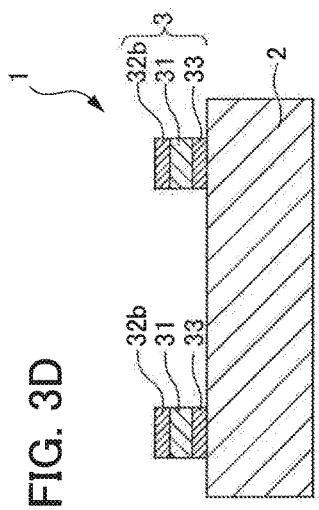

Next, the etching treatment for the etching step is described. This treatment corresponds to a treatment for removing the portion of the conductive base 30 that is not covered with the etching mask 4 by using an etching liquid, as illustrated in FIG. 3(c). By undergoing the treatment, portions other than those to be the wiring pattern 3 are removed from the conductive base 30, and thus, on the surface of the resin base 2, the wiring pattern 3 would remain with a desired shape of the wiring pattern 3. With regard to the etching liquid used for the etching treatment, a known liquid can be used without specific limitations.

[Peeling Step]

Next, the peeling step is described. This step is a step for removing the etching mask 4 by using an alkaline peeling liquid.

Figure 3D:
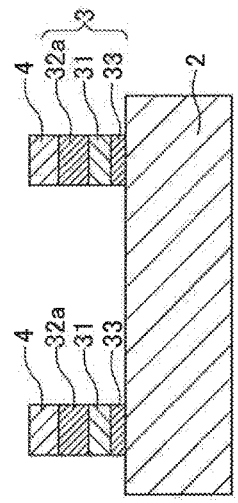

By undergoing this step, the etching mask 4 is removed from the surface of the rust inhibiting protection layer 32a as illustrated in FIG. 3(d). At that time, the surface of the rust inhibiting protection layer 32a is partially dissolved by an alkaline peeling liquid to yield the rust inhibiting protection layer 32b, which is a film thinner than the original rust inhibiting protection layer 32a, having the adhesion amount of zinc of more than 0.5 mg/m$^2$ but 20 mg/m$^2$ or less. Specifically, the rust inhibiting protection layer 32b is a layer that is formed by turning the rust inhibiting protection layer 32a, which has been present on the surface of the conductive base 30, into a thin film. Providing rust inhibiting properties and solder processing suitability of the conductive layer 31 to the collector sheet 1 for solar cells by having the rust inhibiting protection layer 32b as a thin film is the same as those described above.

Examples of the alkaline peeling liquid used for the peeling step include an aqueous solution of caustic soda.

According to the method for producing a collector sheet for solar cells of the present embodiment, the etching mask 4 is completely peeled off in the peeling step and dissolution is made so that the adhesion amount of zinc in the rust inhibiting protection layer 32b remains in the range of more than 0.5 mg/m$^2$ but 20 mg/m$^2$ or less, or preferably more than 0.5 mg/m$^2$ but 6 mg/m$^2$ or less. Thus, it is necessary to determine, by a production test, the condition for having complete removal of the etching mask 4 and having the adhesion amount of zinc in the rust inhibiting protection layer 32b of more than 0.5 mg/m$^2$ but 20 mg/m$^2$ or less. Specifically, since the degree of peeling of the etching mask 4 or the remaining level of the rust inhibiting protection layer 32b varies depending on the type of peeling liquid, the temperature of peeling liquid, the concentration of the peeling liquid, or the treatment time of the peeling step, the condition for the peeling step is suitably determined for the production test. Meanwhile, with regard to the remaining level of the rust inhibiting protection layer 32b, the amount of remaining zinc can be quantified by atomic absorption spectroscopic analysis or the like as described before. Once the condition is determined based on the production test, the main production can be performed by using the condition.

For example, when using the conductive base 30 having the zinc layer 320 with an adhesion amount (thickness) of 30 mg/m$^2$ and the etching mask 4 with a thickness of 15 μm in which a dry film is photo-cured, by using a peeling liquid with a temperature of 40° C. and a concentration of 1.5 g/L and by performing the impregnation treatment for approximately one minute as a peeling step, the etching mask 4 is completely removed and the adhesion amount (thickness) of the rust inhibiting protection layer 32b is about 10 mg/m$^2$.

Method for Producing Collector Sheet for Solar Cells (Second Embodiment)

Figure 4:
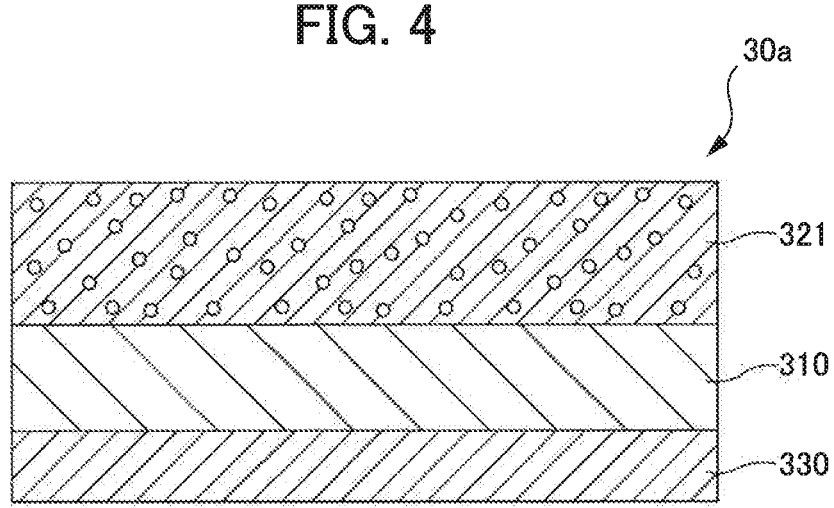
FIG. 4 is a schematic diagram illustrating the layer configuration of a second conductive base which can be used for a second embodiment of the method for producing the wiring sheet of the present invention.

Next, the second embodiment of the method for producing a collector sheet for solar cells of the present invention (hereinafter, also referred to as the "second production method") is described with reference to FIG. 4 and FIGS. 5(a) to 5(f). FIG. 4 is a schematic diagram illustrating the layer configuration of a second conductive base as a material for constituting the wiring pattern 3 of the second embodiment of the method for producing the collector sheet for solar cells of the present invention. FIGS. 5(a) to 5(f) are schematic diagrams sequentially illustrating the wiring pattern formation according to the second embodiment of the method for producing the collector sheet for solar cells of the present invention.

First, a second conductive base 30a as a material for constituting the wiring pattern 3 of the second method of the present invention is described with reference to FIG. 4.

The second conductive base 30a is a conductive thin film obtained by forming a first rust inhibiting protection layer 321 on one surface of the copper foil 310, and it can be preferably used as a base for constituting the wiring pattern 3 when the collector sheet 1 for solar cells is produced according to the second production method of the present invention that is described below in detail.

As described in the present specification, the first rust inhibiting protection layer means a rust inhibiting protection layer which is formed in advance on the surface of the copper foil as the material for constituting the wiring pattern 3 before lamination of the copper foil as a part of conductive base on a resin base. Meanwhile, in the second production method, the rust inhibiting protection layer that is newly formed, on a surface on which the first rust inhibiting protection layer of the copper foil has been already formed, after removing the first rust inhibiting protection layer, is defined as the first rust inhibiting protection layer.

The first rust inhibiting protection layer 321 is a layer formed as a thin film on one surface of the copper foil 310 to inhibit the oxidation of the surface of the copper foil 310, and may be formed by using an inorganic rust inhibitor containing chrome, zinc, phosphate, nickel, or the like. As an example of the first rust inhibiting protection layer 321 which is particularly widely used among them, a rust inhibiting protection layer composed of zinc and chrome can be given.

The surface of the second conductive base 30*a* opposite to the surface on which the first rust inhibiting protection layer 321 is formed becomes a surface of the wiring pattern 3 to which the resin base 2 is joined when it is used as the wiring pattern 3 of the collector sheet 1 for solar cells. For such reasons, although it is not required to have the rust inhibiting property or solderability as high as those of the surface on which the first rust inhibiting protection layer 321 is formed, it is preferable to form a rear surface treatment layer 331 that is composed of the same composition as the first rust inhibiting protection layer 321 to ensure a suitable rust inhibiting property.

According to the second production method, the first rust inhibiting protection layer 321 is completely removed during the production process as described below in detail. For such reasons, not only with a universal conductive base having a rust inhibiting protection layer composed of zinc and chrome that are obtainable at relatively low cost but also with a base having a rust inhibiting layer containing at least a rust inhibitor other than zinc or tin, a collector sheet for solar cells having excellent solder processing suitability can be produced by the second production method, regardless of the composition or modes of the rust inhibiting protection layer on a conductive base.

A second rust inhibiting protection layer 322 is a thin metal layer formed on the surface of the copper foil to suppress the oxidation of the surface of the copper foil 310. Regarding a metal for forming the second rust inhibiting protection layer 322, zinc or tin can be used for obtaining both rust inhibiting properties and solder processing suitability.

Next, details of the second production method are described with reference to FIGS. 5(*a*) to 5(*f*). Meanwhile, explanations of the steps that are common to the first embodiment of the production method of the present invention (hereinafter, also referred to as the "first production method") are partially omitted, while explanations are given mainly for the characteristic step that is different from the first production method.

[Laminating Step]

As illustrated in FIG. 5(*a*), the laminating step is a step for obtaining a second laminate 10*a* by laminating the second conductive base 30*a* and the resin base 2. This step can be performed in the same manner as the first production method.

[Etching Step]

The etching step is a step for removing the second conductive base 30*a* in an area not covered by the etching mask 4 by performing the etching treatment after producing the etching mask 4, which has been patterned to the desired wiring pattern shape, on the surface of the second laminate 10*a*.

According to this step, as illustrated in FIG. 5(*b*), the etching mask 4 patterned to the desired wiring pattern shape on the surface of the second laminate 10*a* (that is, surface of the first rust inhibiting protection layer 321) is firstly produced. The etching mask 4 is created to avoid corrosion of the area of the second conductive base 30*a*, which later will be the wiring pattern 3, as caused by an etching liquid during the etching step to be described below. In other words, the shape observed from the plane of the wiring pattern 3 to be produced and the shape observed from the plane of the etching mask 4 are identical to each other. Methods for forming the etching mask 4 are not particularly limited. The etching mask 4 may be formed on the surface of the second laminate 10*a* by, for example, sensitizing a photoresist or a dry film by passing via a photomask followed by development, or may be formed on the surface of the second laminate 10*a* according to a printing method using an ink jet printer or the like.

The etching mask 4 is required to be peeled with an alkaline peeling liquid during the peeling step to be described below. From this point of view, it is preferable to produce the etching mask 4 by using a photoresist or a dry film.

Next, the etching treatment of the etching step is described. This treatment corresponds to a treatment for removing the second conductive base 30*a* in the area that is not covered with the etching mask 4 by using an etching liquid, as illustrated in FIG. 5(*c*). By undergoing the treatment, portions other than those to be the wiring pattern 3 are removed from the second conductive base 30*a*, and thus, on the surface of the resin base 2, the rear surface treatment layer 331, the copper foil 310, the first rust inhibiting protection layer 321, and the etching mask 4 would remain with the desired shape of the wiring pattern 3.

With regard to the etching liquid used for the etching treatment, a known liquid can be used without specific limitations. For the etching treatment, the first rust inhibiting protection layer 321, the copper foil 310, and the rear surface treatment layer 331, which constitute the second conductive base 30*a*, may be removed by a single treatment or it is also possible to divide the treatments for removing each layer as needed and perform them several times.

[Step for Removing First Rust Inhibiting Protection Layer]

Next, the step for removing the first rust inhibiting protection layer is described. This step is a step for removing the first rust inhibiting protection layer 321 on the copper foil 310. In order to surely prevent the oxidation of copper foil, it is preferable to remove the first rust inhibiting protection layer 321 from the copper foil 310 formed to have a shape of the wiring pattern 3 after the etching step. However, it is also possible to remove in advance the first rust inhibiting protection layer 321 before the etching step according to the method to be described below. Hereinafter, a case in which removal is made from the copper foil 310 formed to have the shape of the wiring pattern 3 after the etching step is described.

According to the step for removing the first rust inhibiting protection layer, the etching mask 4 may be removed simultaneously with the removal of the first rust inhibiting protection layer 321 on the copper foil 310. However, before removing the first rust inhibiting protection layer 321, it is also possible to separately perform the peeling treatment for removing the etching mask 4 by using an alkaline peeling liquid. For such a case, the etching mask 4 can be removed by using an alkaline peeling liquid. Examples of the alkaline peeling liquid include an aqueous solution of caustic soda.

According to the peeling treatment, the etching mask 4 is removed from the surface of the first rust inhibiting protection layer 321 as illustrated in FIG. 5(*d*). At that time, the surface of the first rust inhibiting protection layer 321 is partially dissolved by an alkaline peeling liquid to yield a layer, which is a thinner film than the original first rust inhibiting protection layer 321.

Meanwhile, by increasing the temperature of the peeling liquid or increasing the concentration of the peeling liquid or the like for the peeling treatment, the peeling conditions can be suitably adjusted so that not just a part of the first rust inhibiting protection layer 321 but the entire layer can be removed from the surface of the copper foil 310. In that case, the peeling treatment becomes the step for removing the first rust inhibiting protection layer.

The step for removing the first rust inhibiting protection layer can be performed by the peeling step. However, for complete removal of the first rust inhibiting protection layer 321, it is more preferable to perform the removing step by chemical polishing. The chemical polishing can be carried out by cleaning the first rust inhibiting protection layer 321 with a conventionally known chemical polishing liquid, that is, an acidic cleaning agent containing sulfuric acid, formic acid, hydrochloric acid, or the like and other solvent. Furthermore, the cleaning agent may contain an organic or inorganic rust inhibitor. As an example, the aqueous solution containing sulfuric acid and hydrogen peroxide described in Japanese Unexamined Patent Application, Publication No. H6-112646 can be preferably used. Meanwhile, as described above, the chemical polishing may be further performed in addition to the aforementioned peeling treatment, or it is also possible to remove simultaneously the etching mask and the first rust inhibiting protection layer 321 by chemical polishing without performing the peeling treatment.

By undergoing this step, a state is obtained in which the first rust inhibiting protection layer 321 is completely removed from the surface of the copper foil 310 and the copper foil constituting the copper foil 310 is exposed on the surface of the wiring pattern 3, as illustrated in FIG. 5(*e*).

Meanwhile, in order to suppress the progress of oxidation of the copper foil surface either simultaneously with the step for removing the first rust inhibiting protection layer or for a period immediately after the completion of the step until the subsequent step for forming the second rust inhibiting protection layer, a pseudo rust inhibiting treatment may be performed by using an organic rust inhibitor such as benzotriazole.

[Step for Forming the Second Rust Inhibiting Protection Layer]

Next, the step for forming the second rust inhibiting protection layer is described. This is a step for removing the first rust inhibiting protection layer 321 in the aforementioned step for removing the first rust inhibiting protection layer to form the second rust inhibiting protection layer 322 on the copper foil 310, which is in an exposed state on the surface of the pattern 3.

As described above, the second rust inhibiting protection layer 322 is a metal thin layer composed of zinc and/or tin, which is formed on the surface of the copper foil 310. It is preferable from the viewpoint of having both the rust inhibiting properties and solder processing suitability as the surface treatment layer of the wiring pattern 3.

Specifically, when the metal for forming the second rust inhibiting protection layer 322 is zinc, the adhesion amount of zinc for forming the second rust inhibiting protection layer 322 on the surface of the copper foil 310 is, as described above, preferably more than 0.5 mg/m$^2$ but 20 mg/m$^2$ or less, and more preferably more than 0.5 mg/m$^2$ but 6 mg/m$^2$ or less.

As a method for forming the second rust inhibiting protection layer 322 composed of zinc on the surface of the copper foil 310, plating, sputtering, or vapor deposition can be used. However, for evenly forming an extremely thin layer as described above, it is preferable to use electroless plating. A conventionally known method of electroless plating can be used. Specifically, it is preferable that, after treating the surface of the copper foil 310 with a surfactant and applying a plating catalyst such as palladium, the second rust inhibiting protection layer 322 be formed by impregnation in an electroless plating solution containing zinc. The adhesion amount of zinc in the aforementioned second rust inhibiting protection layer 322 may be suitably adjusted to a preferred range by controlling the treatment temperature and treatment time.

Meanwhile, the amount of zinc contained in the second rust inhibiting protection layer 322 is a trace amount as described above. For quantification of a trace amount of zinc, the second rust inhibiting protection layer 322 with known area is dissolved with acid or alkali, and the amount of zinc atoms contained in the resulting solution may be quantified by atomic absorption spectroscopic analysis.

When the metal for forming the second rust inhibiting protection layer 322 is tin, the upper limit of the amount of tin is not particularly limited, if it is an amount of more than 0.005 mg/m$^2$. When the amount of tin contained in the second rust inhibiting protection layer 322 is 0.005 mg/m$^2$ or less, a sufficient rust inhibiting effect cannot be obtained for the copper foil 310. As it is evident from the fact that tin is generally used as a component of a solder, it does not inhibit the solder processing suitability. Meanwhile, because tin has a higher ionization tendency than copper, corrosion of tin occurs first. Accordingly, the corrosion of copper can be prevented, and thus tin has also a certain rust inhibiting effect. As described above, by using tin as a metal for forming the second rust inhibiting protection layer 322, the collector sheet 1 for solar cells having both the solder processing suitability and rust inhibiting properties can be produced.

As a method for forming the second rust inhibiting protection layer 322 composed of tin on the surface of the copper foil 310, plating, sputtering, or vapor deposition can be used. However, forming by plating which enables production with simple facilities is preferable, and in particular, forming the second rust inhibiting protection layer 322 by performing impregnation in a plating bath is preferable.

To prevent surface oxidation of the copper foil 310, the step for forming the second rust inhibiting protection layer is started after the completion of the foregoing step for removing the first rust inhibiting protection layer but quickly before the start of the oxidation on the surface of the copper foil. With regard to the expression "before the start of the oxidation on the surface of the copper foil", it is sufficient to have a state not having changes in appearance such as discoloration caused by oxidation, and by starting the step for forming the second rust inhibiting protection layer during such state, oxidation of the copper foil either during or after the production process is prevented, and thus a collector sheet for solar cells having good solder processing suitability can be produced.

More specifically, it is preferable that the step for removing the first rust inhibiting protection layer and the step for forming the second rust inhibiting protection layer be continuously performed in the same production facility. By doing so, oxidation of the copper foil after the step for removing the first rust inhibiting protection layer can be more certainly prevented. The expression "in the same production facility" includes a case of performing literally in a single production facility and a case of performing the production by a so-called in-line continuous production mode, and it is more preferable that the step for removing the first rust inhibiting protection layer and the step for forming the second rust inhibiting protection layer be performed with the facility in an oxygen-free state.

According to a method for producing a collector sheet for solar cells of a related art, the surface protection layer formed on the surface of copper foil is an essential element for preventing oxidation of copper foil for constituting a conductive base and it is considered to be non-omittable in the entire process for producing a collector sheet for solar cells. However, according to the second embodiment of the method for producing a collector sheet for solar cells of the present invention, it is possible to remove the surface protection layer during the production process, and as a result, a collector sheet for solar cells having good solder processing suitability can be produced regardless of the mode of the surface treatment of the conductive base.

Meanwhile, with the collector sheet for solar cells produced by the second production method, so-called soldering short circuit can be desirably prevented similar to the case in which production is carried out with the first production method.

Solar Cell Module

Hereinafter, a solar cell module using the collector sheet for solar cells, which is produced by the production method of the present invention, is described.

The collector sheet 1 for solar cells is installed in a solar cell module and used as electric wiring in the module. According to joining by soldering of the surface of the conductive layer 31 of the collector sheet 1 for solar cells to an electrode of a solar cell element via the rust inhibiting protection layer 32, the collector sheet 1 for solar cells and the solar cell element are electrically joined, yielding electric wiring.

As described herein, an electrode of a solar cell element indicates an electrode for transmitting electric power, which has been generated by a solar cell element receiving light, to the outside of a solar cell element. Although not particularly limited, the electrode is composed of silver or a silver compound, or the like, for example.

Furthermore, as for the solder used for the solder processing, a conventionally known one can be used without specific limitations. Examples of the solder include a lead-tin alloy, silver-containing solder, lead-free solder, tin-bismuth, and tin-bismuth-silver. A conventionally known method can be used for joining the electrode of a solar cell element to the surface of the copper foil 310 via the rust inhibiting protection layer 32 by solder processing, without specific limitations.

If necessary, in combination with a transparent front board, a surface side sealer sheet, a rear side sealer sheet, a back surface protection sheet, or the like, a joined body of the collector sheet 1 for solar cells and a solar cell element is prepared as a solar cell module.

As an example of the solar cell module, those obtained by laminating, from the surface side of a solar cell module, a transparent front board, a surface side sealer sheet, a joined body of an solar cell element and a collector sheet 1 for solar cells, a back surface side sealer sheet, and a back surface protection sheet in this order and integrating them by vacuum thermal lamination can be mentioned. However, it is not limited to such configuration, and the configuration can be suitably achieved in consideration of performances that are required for a solar cell module.

Method for Producing Solar Cell Module

Figure 7:
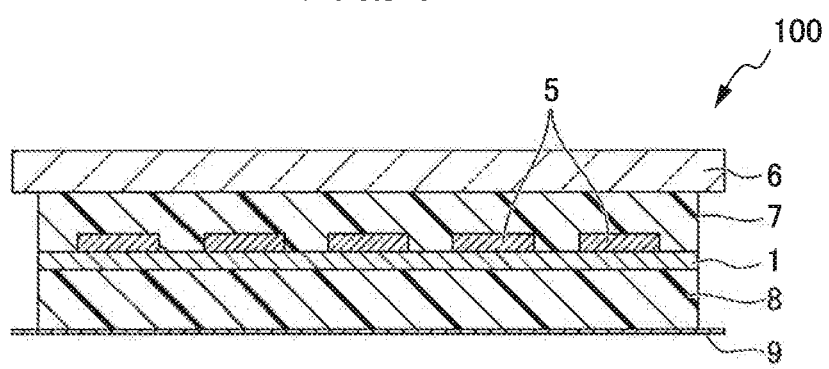
FIG. 7 is a schematic diagram illustrating the layer configuration of a solar cell module that is produced by the method for producing the solar cell module of the present invention.

Next, the method for producing a solar cell module is described with reference to FIG. 6 and FIG. 7. FIG. 6 is a perspective view schematically illustrating the state in which the collector sheet 1 for solar cells is joined to a solar cell element 5. FIG. 7 is a schematic diagram illustrating the layer configuration of a solar cell module 100 that is produced by the method for producing a solar cell module of the present invention.

[Solder Joining Step]

As illustrated in FIG. 6, after the step for producing a collector sheet for solar cells by which the collector sheet 1 for solar cells is produced based on the method for producing a solar cell module of the present invention, the surface of the wiring pattern 3 of the collector sheet 1 for solar cells and the electrode of the solar cell element 5 are joined by soldering. Specifically, the copper foil 310 is joined, via the rust inhibiting protection layer 32 (or the second rust inhibiting protection layer 322) to an electrode of the solar cell element 5 (not illustrated) by soldering. Accordingly, the collector sheet 1 for solar cells and the solar cell element 5 are electrically joined to each other to become the electric wiring within a solar cell module. Meanwhile, if necessary, other than the wiring by the collector sheet 1 for solar cells, further wiring using a ribbon-like wire or the like can be also carried out within a solar cell module.

As described herein, the electrode of the solar cell element 5 indicates an electrode for transmitting electric power, which has been generated by the solar cell element 5 receiving light on the outside of the solar cell element 5. Although not particularly limited, the electrode is composed of silver or a silver compound, or the like, for example.

Furthermore, as for the solder used for joining the electrode of the solar cell element 5 to the surface of the copper foil 310 via the rust inhibiting protection layer 32 (or the second rust inhibiting protection layer 322) by solder processing, a conventionally known solder may be used without specific limitations. Examples of the solder include a lead-tin alloy, silver-containing solder, lead-free solder, tin-bismuth, and tin-bismuth-silver.

Furthermore, according to the method for producing a solar cell module of the present embodiment, the solder for use is an alloy/resin composite system which consists of a conductive alloy component and a resin component with a high insulating property. A method including coating almost the entire surface of the collector sheet for solar cells with the solder, overlaying it with the collector sheet for solar cells, performing phase separation of the alloy and resin by transferring the alloy component on the wiring pattern while leaving the resin component of the solder between the wirings when the collector sheet for solar cells and the solar cell element are joined by heating after re-flowing, and joining it to the wiring pattern with the alloy component of the solder can be preferably used. In other words, the alloy and the resin need to be quickly separated by re-flowing in such a case. Since the collector sheet 1 for solar cells has excellent wettability in the wiring pattern portion, transfer of the alloy portion occurs quickly.

[Module Integration Step]

As illustrated in FIG. 7, by combining the joined body of the collector sheet 1 for solar cells and the solar cell element 5 with a transparent front board 6, a surface side sealer sheet 7, a back surface side sealer sheet 8, and a back surface protection sheet 9, if necessary, the solar cell module 100 is yielded.

As illustrated in FIG. 7, the solar cell module 100 can be produced by laminating, from the surface side of a solar cell module, the transparent front board 6, the surface side sealer sheet 7, the joined body of the solar cell element 5 and the collector sheet 1 for solar cells, the back surface side sealer sheet 8, and the back surface protection sheet 9 in this order, and integrating them by vacuum thermal lamination.

According to the method for producing the wiring part of a collector sheet for solar cells and the method for producing a solar cell module described above, the effects as follows are exhibited.

(1) It is essential for a conductive base composed of a copper foil, which is used for the wiring pattern of a collector sheet for solar cells, to have a surface treatment for the purpose of having rust inhibiting properties. On the other hand, such treatment exhibits an undesirable influence on the solder processing suitability that is required for the wiring pattern of the collector sheet for solar cells. Accordingly, with regard to the conductive base according to the present invention, an independent study has been made for the configuration of the conductive base to solve the problem. Specifically, a conductive base having a configuration characterized in that a zinc layer in adhesion amount of more than 20 mg/m$^2$ but 40 mg/m$^2$ or less is formed on at least one surface of the copper foil with a thickness of 10 μm to 35 μm is provided. Accordingly, a conductive base capable of forming the wiring pattern of a collector sheet for solar cells having good rust inhibiting properties and solderability can be provided without using an organic rust inhibitor.

(2) Furthermore, a conductive base is provided in which copper foil is formed by electrolytic foil forming and the zinc layer is formed on the glossy surface of the copper foil. Accordingly, the solder processing suitability of the conductive base can be improved more.

(3) It also has a configuration that, on the top of the zinc layer, one or more function reinforcing layers are formed, and no layer in the function reinforcing layers contains chrome. Accordingly, other physical properties such as heat resistance of the conductive base can be suitably improved without inhibiting excellent solder processing suitability.

(4) With regard to the method for producing a collector sheet for solar cells, by carrying out an independent study on the production process, the object of obtaining both the rust inhibiting properties and solder processing suitability of the wiring pattern is attained. Specifically, as a method for producing a collector sheet for solar cells, provided is a method for producing a collector sheet for solar cells having a laminating step for laminating a resin base to obtain a laminate, an etching step for removing the conductive base in an area not covered by an etching mask by performing the etching treatment after forming the etching mask patterned to the desired wiring pattern shape, and a peeling step for removing the etching mask after the etching step by using an alkaline peeling liquid, in which, by removing a part of the surface of the zinc layer with peeling of the etching mask by using the alkaline peeling liquid during the peeling step, a rust inhibiting protection layer in which the adhesion amount of zinc is more than 0.5 mg/m$^2$ but 20 mg/m$^2$ or less is formed on the surface of the wiring pattern. Accordingly, the wiring pattern collector sheet for solar cells in which rust inhibiting properties and good solder processing suitability are given to a collector sheet for solar cells can be produced without using an organic rust inhibitor.

(5) Furthermore, the method for producing a collector sheet for solar cells is a production method having a laminating step, an etching step, a step for removing a first rust inhibiting protection layer by which a first rust inhibiting protection layer is removed from the surface of the copper foil, and a step for forming a second rust inhibiting protection layer by which a second rust inhibiting protection layer is formed on the copper foil after the step for removing the first rust inhibiting protection layer, characterized in that the first rust inhibiting protection layer is composed by containing at least a rust inhibitor other than zinc or tin, and the second rust inhibiting protection layer is composed of zinc and/or tin. Accordingly, the complete removal of the first rust inhibiting protection layer during the process for producing a collector sheet for solar cells and the formation of the second rust inhibiting protection layer during a subsequent process can be achieved. Thus, regardless of the mode of the rust inhibiting surface treatment, a collector sheet for solar cells having good solder processing suitability can be produced.

(6) Furthermore, in the production method, the step for removing a first rust inhibiting protection layer and the step for forming a second rust inhibiting protection layer are continuously performed in the same production facility. Accordingly, oxidation of a copper foil after the step for removing the first rust inhibiting protection layer can be more certainly prevented.

(7) Furthermore, the step for removing the first rust inhibiting protection layer is a step for removing the first rust inhibiting protection layer by chemical polishing using an acidic cleaning agent. Accordingly, the removal of the first rust inhibiting protection layer can be achieved more completely.

(8) Furthermore, the second rust inhibiting protection layer is a layer composed of zinc and the adhesion amount of zinc on the surface of the copper foil is more than 0.5 mg/m$^2$ but 20 mg/m$^2$ or less. Accordingly, both the rust inhibiting properties and solder processing suitability can be given to the copper foil constituting the conductive layer. As such, a collector sheet for solar cells having good solder processing suitability can be produced.

(9) Furthermore, the first rust inhibiting protection layer is a layer containing chrome and zinc. Accordingly, a collector sheet for solar cells having excellent solder processing suitability can be produced even in a case in which a universal conductive base that is obtainable at relatively low cost is used.

(10) Furthermore, according to the aforementioned method for producing a solar cell module having a step for producing a collector sheet for solar cells by which the collector sheet for solar cells is produced by the aforementioned production method, a solder joining step by which an electrode of a solar cell element is joined by solder processing to the surface of the wiring pattern of the collector sheet for solar cells that is produced by the aforementioned step for producing a collector sheet for solar cells, and a module integration step by which a joined body consisting of the solar cell element and the collector sheet for solar cells that are joined by the solder joining step is laminated with other members constituting the solar cell module for integration, the collector sheet for solar cells can have good solder processing suitability, and thus a solar cell module which can preferably inhibit soldering short circuit and also has excellent durability can be produced.

Above, the conductive base for the wiring pattern of a collector sheet for solar cells, the method for producing a collector sheet for solar cells, and the method for producing a solar cell module have been specifically described based on modes for carrying out them and their embodiments. However, the present invention is not limited to the modes for carrying out them and their embodiments, and a suitable modification can be made within the constitutional scope of the present invention.

EXAMPLES

Hereinafter, the present invention is described further in more detail by Examples. However, the present invention is not limited to the following Examples.

Test Example 1

As Example and Comparative Example, an evaluation sample of a collector sheet for solar cells was prepared (hereinafter, also simply referred to as a "sample"). For each sample, solder adhesion suitability and rust inhibiting properties were evaluated.

A laminate obtained by laminating a conductive base having a zinc layer with an adhesion amount of 30 mg/m$^2$ formed by zinc electrolytic plating on the glossy surface of the copper foil with a thickness of 25 μm, which is obtained by electrolytic foil forming, onto the surface of sheet-like molded polyethylene naphthalate (PEN) (thickness: 50 μm) according to dry lamination was used. On the surface of the laminate, an etching mask with a thickness of 80 μm, a width of 150 mm, and a length of 150 mm was prepared by using a dry film.

After that, by using an aqueous solution of iron (II) chloride at a temperature of 45° C. and with a concentration of 250 g/L as an etching liquid, the laminate sheet formed with the etching mask was immersed in the etching liquid for approximately 2 minutes, and subsequently cleaned with pure water. As a result, the conductive base in an area not coated with the etching mask was removed.

Next, as a peeling step, the laminate obtained after the etching treatment was immersed in a peeling liquid, which is an aqueous solution of caustic soda at a temperature of 40° C. and with a concentration of 1.5 g/L, for the time described in Table 1. Subsequently, it was cleaned with pure water. As a result, a wiring pattern with a width of 150 mm and a length of 150 mm, which consists of a conductive base, was formed on the surface of the base. The results of quantifying the amount of zinc contained in a rust inhibiting layer (zinc layer) of the wiring pattern, which is obtained by atomic absorption spectroscopic analysis, are described in Table 1.

Solder adhesion suitability was tested for each of the evaluation samples of the collector sheet for solar cells of Examples 1 to 3 and Comparative Examples 1 and 2 that are described in Table 1. The solder used for the test includes 42% of tin, 57% of bismuth, and 1% of silver (type TCAP-5405, manufactured by Tamura Kaken Corporation) as an alloy component. The solder was coated onto the entire surface of the collector sheet for solar cells. Then, the collector sheet for solar cells was molten by heating on a hot plate so that it reaches the solder melting temperature of 160 to 170° C. Accordingly, the alloy component of the solder was transferred to the wiring pattern portion of the collector sheet for solar cells. The solder adhesion suitability was visually evaluated based on the following criteria.

A: The solder was spread over the wiring pattern and good wettability was shown.

B: Although the solder was projectedly attached onto the surface of the wiring pattern, the adhesion property was good.

C: The solder was projectedly attached onto the surface of the wiring pattern, and the adhesion property was poor.

The rust inhibiting property was evaluated for each of the evaluation samples of the collector sheet for solar cells of Examples 1 to 3 and Comparative Examples 1 and 2 that are described in Table 1, by leaving each sample to stand for 24 hours at 85° C. and 85% RH. The rust inhibiting property was visually evaluated based on the following criteria.

A: No cloudiness occurs on the surface of the wiring pattern.

B: Metallic glossiness on the surface of the wiring pattern was slightly lowered.

C: The wiring pattern was slightly discolored.

TABLE 1

| | Peeling time for peeling step (Second) | Amount of zinc contained in rust inhibiting protection layer (mg/cm$^2$) | Solder adhesion suitability | Rust inhibiting property |
|---|---|---|---|---|
| Example 1 | 90 | 5 | A | A |
| Example 2 | 60 | 10 | A | A |
| Example 3 | 40 | 15 | A | A |
| Comparative Example 1 | 120 | 0.5 | A | C |
| Comparative Example 2 | 10 | 30 | C | A |

As described in Table 1, it is found that in the collector sheet for solar cells of Examples 1 to 3 in which the amount of zinc contained in the rust inhibiting protection layer is 5 to 15 mg/m$^2$, both the solder adhesion suitability and rust inhibiting property can be obtained, but Comparative Examples 1 and 2 cannot satisfy one of the solder adhesion suitability and rust inhibiting property. From the above, it is possible to confirm the effectiveness of the collector sheet for solar cells using the conductive base of the present invention.

Test Example 2

The evaluation samples of the collector sheet for solar cells for Examples 4 to 7 and Comparative Examples 3 and 4 were obtained in the same manner as Test Example 1 except that the amount of zinc contained in the rust inhibiting protection layer is adjusted to the amount described in Table 2. Next, on each collector sheet for solar cells, solder was applied to have a circular shape by using a screen with a diameter of 6 mm. After that, the collector sheet for solar cells was molten by heating on a hot plate so that it reaches the solder melting temperature of 160 to 170° C. followed by cooling by leaving the collector sheet to stand.

At that time, the solder formed an approximately convex hemisphere (dome shape) on the copper surface in terms of cross-sectional view due to surface tension. The height was measured using a micrometer and determined as the solder projection height (average value of N=3). Furthermore, the application amount of the solder was separately measured for each spot and the solder projection height per unit weight was obtained. Furthermore, the visual appearance state of the wettability was expressed according to three levels similar to Test Example 1. The results are summarized and given in Table 2. Furthermore, in FIG. 8, the relation between the zinc amount contained in the rust inhibiting protection layer expressed by the horizontal axis and the solder projection height per unit weight expressed by the vertical axis was illustrated as a graph.

TABLE 2

|  | Amount of Zn [mg/m²] | Wettability observed by naked eye | Solder mass [mg] | Solder projection height [µ] | Solder projection height per unit mass [µ/mg] | Solder projection height per unit mass [µ/mg] (Average) |
|---|---|---|---|---|---|---|
| Comparative Example 3 | 25 | C | 9.6 | 138 | 14.4 | 19.7 |
|  |  |  | 13.5 | 278 | 20.6 |  |
|  |  |  | 13 | 314 | 24.2 |  |
| Example 4 | 20 | B | 15.3 | 189 | 12.4 | 12.5 |
|  |  |  | 18.8 | 203 | 10.8 |  |
|  |  |  | 14 | 200 | 14.3 |  |
| Example 5 | 15 | B | 15 | 87 | 5.8 | 9.3 |
|  |  |  | 11.2 | 124 | 11.1 |  |
|  |  |  | 8.6 | 96 | 11.2 |  |
| Example 6 | 5 | A | 9.7 | 90 | 9.3 | 8.9 |
|  |  |  | 10 | 67 | 5.7 |  |
|  |  |  | 11.4 | 122 | 10.7 |  |
| Example 7 | 3 or less | A | 14.1 | 103 | 7.3 | 7.3 |
|  |  |  | 14.3 | 108 | 7.6 |  |
|  |  |  | 14.3 | 99 | 6.9 |  |
| Comparative Example 4 | 0 | — | Not evaluated due to occurrence of rust | | | |

Figure 8:
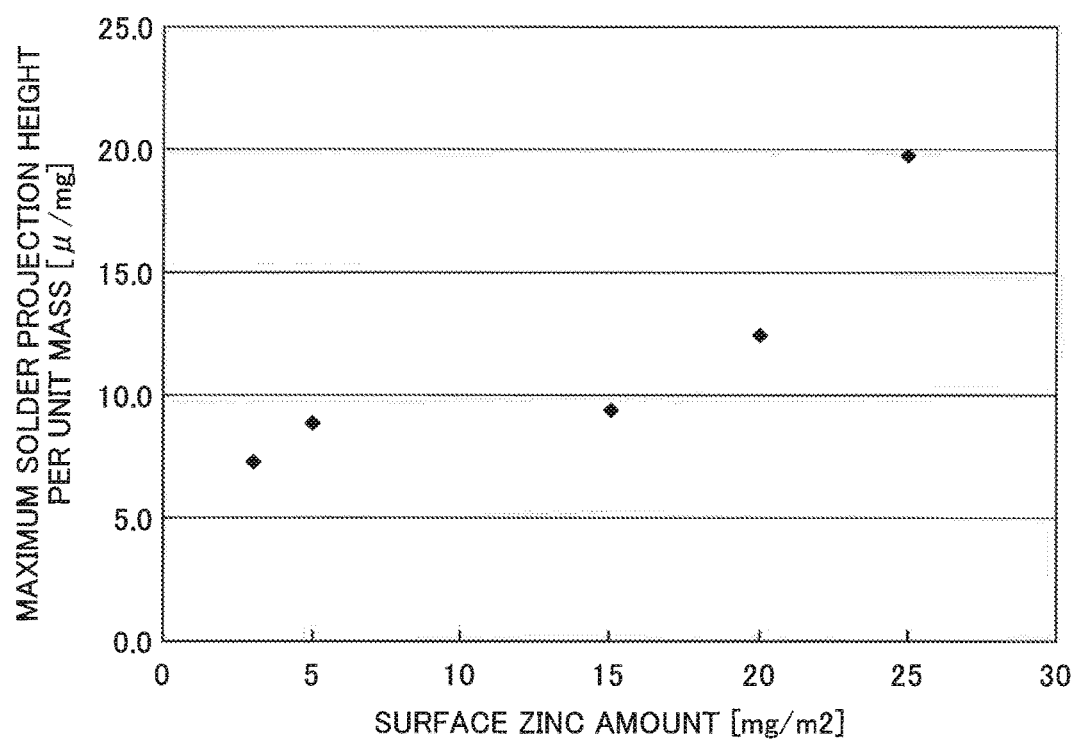
FIG. 8 is a graph illustrating the relation between the surface zinc amount and the solder projection height in Example 2.

As illustrated in Table 2 and FIG. 8, it can be understood that the wettability is improved by having the zinc amount in the range and preferred range of the present invention. Meanwhile, when the zinc amount is zero (Comparative Example 4), rust had occurred on the copper surface at the time of starting the measurement, and thus no evaluation was made. Thus, in Table 2, the visual evaluation of wettability was described as "-."

Furthermore, from Table 2 and FIG. 8, it was found that the solder projection height obtained after applying solder in spot shapes followed by melting and cooling is suitable as an indicator of wettability. Meanwhile, when it is difficult to have a constant application amount for each spot, it is possible to measure the solder application amount and use the measured amount as the solder projection height per unit weight, and the accuracy is improved accordingly. According to Examples, it can be understood that the critical point of the wettability is present near the zinc amount of 20 mg (solder projection height of 10 µm or so). By using the method, the wettability can be briefly compared only with the measurement of projection height, and thus the method is also very useful as an evaluation method.

Test Example 3

A laminate obtained by laminating a conductive base having a zinc layer with an adhesion amount of 5 mg/m² and also a chrome layer with an adhesion amount of 2 mg/m² formed on the top layer by electrolytic plating onto the glossy surface of copper foil with a thickness of 25 µm, which is obtained by electrolytic foil forming, on the surface of the same base as Test Example 1 according to dry lamination was used. On the surface of the laminate, an etching mask with a thickness of 80 µm, a width of 150 mm, and a length of 150 mm was prepared in the same manner as Test Example 1 by using a dry film.

After that, the conductive base in the area not coated with the etching mask was removed with the same method and the same conditions as Test Example 1.

Next, as a peeling step, the laminate obtained after the etching treatment was immersed in a peeling liquid, which is an aqueous solution of caustic soda at a temperature of 40° C. and with a concentration of 1.5 g/L, for only 90 seconds in the same manner as Example 1. Subsequently, it was cleaned with purified water. As a result, a wiring pattern with a width of 150 mm and a length of 150 mm, which consists of a conductive base, was formed on the surface of the base. The amount of chrome contained in the surface layer of the rust inhibiting layer of the wiring pattern was obtained by atomic absorption spectroscopic analysis, and as a result, the adhesion amount of chrome was 2 mg/m².

For the collector sheet for solar cells provided with the chrome layer, the solder adhesion suitability and the rust inhibiting property were evaluated by the test method and evaluation criteria described in Test Example 1 described above. As a result, all of them showed "A" in terms of the rust inhibiting property but "C" in terms of the solder adhesion property.

Test Example 4

As Example, Comparative Example, and Reference Example, an evaluation sample of the collector sheet for solar cells was prepared (hereinafter, also simply referred to as a "sample"). For each sample, the solder adhesion suitability and the rust inhibiting property were evaluated.

[Laminating Step]

To produce samples of Example 8, Comparative Examples 5 to 7, and Reference Examples 1 and 2, the following conductive base was laminated by dry lamination onto the following resin base to obtain a laminate.

Resin base: sheet-like molded polyethylene naphthalate (PEN) (thickness: 50 µm).

Conductive base: copper foil with a thickness of 25 µm having a surface formed, as the first rust inhibiting protection layer, with a zinc layer with an adhesion amount of 20 mg/m² obtained by zinc plating and a chrome layer with an adhesion amount of 2 mg/m² obtained by chrome plating.

[Etching Step]

Furthermore, an etching mask with a thickness of 15 µm, a width of 150 mm, and a length of 150 mm was formed on the surface of the laminate by using a dry film. After that, by using an aqueous solution of iron (II) chloride at a temperature of 45° C. and with a concentration of 250 g/L as an etching liquid, the laminate formed with the etching mask was immersed in the etching liquid for approximately 2 minutes, and subsequently cleaned with pure water. As a result, the conductive base in the area not coated with the etching mask was removed.

[Peeling Step]

Next, as a peeling step, the laminate obtained after the etching step was immersed in a peeling liquid, which is an aqueous solution of caustic soda at a temperature of 40° C. and with a concentration of 1.0 g/L, for the time described in Table 3. Subsequently, it was cleaned with pure water. As a result, a wiring pattern was formed on the surface of the base with a width of 150 mm and a length of 150 mm, in which a conductive layer composed of copper foil and a surface treatment layer composed of zinc are formed.

[Step for Removing First Rust Inhibiting Protection Layer]

Next, as a step for removing the first rust inhibiting protection layer, the first rust inhibiting protection layer formed on the surface of the conductive base of the laminate, which had been obtained after the peeling treatment, was removed by a chemical polishing treatment. For the chemical polishing treatment, 2× dilution of the stock solution of a cleaning agent containing 15 to 20% of sulfuric acid and 10 to 15% of hydrogen peroxide (MECBRITE CA-5330H manufactured by MEC CO., LTD. was used) was performed with ion exchange water, and immersion at room temperature was carried out for 30 seconds. However, the step for removing the first rust inhibiting protection layer was not performed on the laminate as a sample of Comparative Example 1.

[Step for Forming Second Rust Inhibiting Protection Layer]

Next, as a step for forming the second rust inhibiting protection layer, on the surface of the conductive base of the laminate as each sample of Example, Comparative Example 2, and Reference Examples 1 and 2 obtained after performing the step for removing the first rust inhibiting protection layer, the second rust inhibiting protection layer was formed collector sheet for solar cells was molten by heating on a hot plate so that it reaches the solder melting temperature of 160 to 170° C. Accordingly, the alloy component of the solder was transferred to the wiring pattern portion of the collector sheet for solar cells. The solder adhesion suitability was visually evaluated based on the following criteria. The results are described in Table 1.

A: The solder was spread over the wiring pattern and good wettability was shown.

B: Although the solder was projectedly attached on the surface of the wiring pattern, the adhesion property was good.

C: The solder was projectedly attached on the surface of the wiring pattern, and the adhesion property was poor.

For each evaluation sample of Example, Comparative Example, and Reference Example produced in the above, the rust inhibiting property was evaluated. The test was performed by leaving each sample to stand for 24 hours at 85° C. and 85% RH. The rust inhibiting property was visually evaluated based on the following criteria.

A: No cloudiness occurs on the surface of the wiring pattern.

B: Metallic glossiness on the surface of the wiring pattern was slightly lowered.

C: The wiring pattern was slightly discolored.

TABLE 3

| | First rust inhibiting protection layer Presence or absence of removing step | Second rust inhibiting protection layer | | | Solder wettability | Rust inhibiting property |
| --- | --- | --- | --- | --- | --- | --- |
| | | Time until start of formation treatment | Plating time (Second) | Amount of zinc contained in protection layer ($mg/m^2$) | | |
| Example 8 | Removed | 1 Minute | 8 | 10 | A | A |
| Comparative Example 5 | Not removed | — | — | — | C | A |
| Comparative Example 6 | Removed | — | — | — | A | C |
| Reference Example 1 | Removed | 1 Hour | 8 | 10 | A | B |
| Reference Example 2 | Removed | 1 Minute | 1 | 0.5 | A | B |
| Reference Example 3 | Removed | 1 Minute | 20 | 23 | B | A | by electroless plating. The electroless plating was performed by immersion in a zinc plating liquid at 40° C. for each time described in Table 1. Meanwhile, for Example and Reference Examples 1 and 2, the step for forming the second rust inhibiting protection layer was performed continuously one minute after completing the step for removing the first rust inhibiting protection layer, and for Comparative Example 2, it was performed after leaving the sample to stand for three hours after completing the step for removing a first rust inhibiting protection layer.

For the samples of Example, Comparative Example 2, and Reference Examples 1 and 2 obtained after the step for forming the second rust inhibiting protection layer, the amount of zinc contained in the second rust inhibiting protection layer was measured by atomic absorption spectroscopic analysis. The results are described in Table 1. Meanwhile, for the sample of Comparative Example 1 in which the first rust inhibiting protection layer was not removed, the amount of chrome contained in the top layer of the rust inhibiting protection layer was quantified by atomic absorption spectroscopic analysis. As a result, the adhesion amount of chrome was found to be 2 $mg/m^2$.

For each sample of Examples, Comparative Examples, and Reference Examples produced above, the solder adhesion suitability was tested. The solder used for the test includes 42% of tin, 57% of bismuth, and 1% of silver (type TCAP-5405, manufactured by Tamura Kaken Corporation) as an alloy component. The solder was coated onto the entire surface of the collector sheet for solar cells. Then, the As described in Table 3, the sample of Example 8, which was produced by the second production method of the present invention, has desirable solder adhesion suitability and a desirable rust inhibiting property. However, it is found that Comparative Examples 5 and 6, in which the production was made by the second production method of the present invention but without having any one of the constitutional elements of the method of the present invention cannot satisfy one of the solder adhesion suitability and the rust inhibiting property. Furthermore, from the evaluation results of Reference Examples 1 and 2, it was found that the content of zinc contained in the second rust inhibiting protection layer is preferably more than 0.5 $mg/m^2$ but 20 $mg/m^2$ or less. Based on the above, it is possible to confirm the usefulness of the collector sheet for solar cells produced by the second production method of the present invention.

The invention claimed is:

1. A collector sheet for solar cells,
    wherein a zinc layer with an adhesion amount of more than 25 $mg/m^2$ but 30 $mg/m^2$ or less is formed on a glossy surface of an electrolytic copper foil having a thickness of 10 μm to 35 μm and the electrolytic copper foil having a glossy surface and a rough surface having a relatively larger surface roughness than the glossy surface, and
    chrome is not contained in any layer formed on the glossy surface of the electrolytic copper foil, and
    a resin base is joined onto the rough surface of the electrolytic copper foil.

2. The collector sheet according to claim 1, wherein one or more function reinforcing layers containing no chrome are further formed on the zinc layer.

3. A method for producing a collector sheet for solar cells comprising:
- a laminating step by which the conductive base according to claim 1 is laminated with a resin base to obtain a laminate;
- an etching step by which an etching mask patterned to have a desired wiring pattern shape is formed on the surface of the laminate followed by an etching treatment to remove the conductive base in an area not covered with the etching mask; and
- a peeling step by which the etching mask is removed after the etching step by using an alkaline peeling liquid,
- wherein by removing a part of the surface of the zinc layer with peeling of the etching mask by using the alkaline peeling liquid during the peeling step, a rust inhibiting protection layer in which the adhesion amount of zinc is more than $0.5$ $mg/m^2$ but $20$ $mg/m^2$ or less is formed on the surface of the wiring pattern.

4. The method of claim 3, comprising a laminating step by which the conductive base according to claim 1 is laminated with a resin base to obtain a laminate.

5. The method of claim 3, comprising a laminating step by which the conductive base according to claim 2 is laminated with a resin base to obtain a laminate.

\* \* \* \* \*